(12) United States Patent
Okuno et al.

(10) Patent No.: US 10,834,835 B2
(45) Date of Patent: Nov. 10, 2020

(54) HERMETIC TERMINAL FOR HDD DEVICE AND HARD DISK DEVICE

(71) Applicant: SCHOTT Japan Corporation, Koka (JP)

(72) Inventors: Akira Okuno, Koka (JP); Tetsushi Morikawa, Koka (JP)

(73) Assignee: SCHOTT Japan Corporation, Koka (JP)

( * ) Notice: Subject to any disclaimer, the term of this patent is extended or adjusted under 35 U.S.C. 154(b) by 106 days.

(21) Appl. No.: 16/309,684

(22) PCT Filed: Jun. 20, 2017

(86) PCT No.: PCT/JP2017/022679
§ 371 (c)(1),
(2) Date: Dec. 13, 2018

(87) PCT Pub. No.: WO2018/003601
PCT Pub. Date: Jan. 4, 2018

(65) Prior Publication Data
US 2019/0313539 A1    Oct. 10, 2019

(30) Foreign Application Priority Data

Jul. 1, 2016   (JP) .................................. 2016-131196

(51) Int. Cl.
*H05K 5/06*     (2006.01)
*H05K 5/00*     (2006.01)
(Continued)

(52) U.S. Cl.
CPC ........... *H05K 5/0095* (2013.01); *G11B 25/04* (2013.01); *G11B 25/043* (2013.01); *G11B 33/12* (2013.01);
(Continued)

(58) Field of Classification Search
CPC .......... H05K 5/00; H05K 5/06; H05K 5/0095; H05K 5/069; G11B 33/14; G11B 25/04;
(Continued)

(56) References Cited

U.S. PATENT DOCUMENTS 6,150,616 A    11/2000   Kazama
7,327,553 B2 *  2/2008   Brendel .................. H01G 4/35
                                              361/302
(Continued)

FOREIGN PATENT DOCUMENTS

JP    09-329624 A    12/1997
JP    2000-021683 A   1/2000
(Continued)

OTHER PUBLICATIONS

English translation of the International Search Report of the International Searching Authority for International Application PCT/JP2017/022679, dated Sep. 5, 2017, 2 pages, Japan Patent Office, Tokyo, Japan.
(Continued)

*Primary Examiner* — Angel R Estrada
(74) *Attorney, Agent, or Firm* — W. F. Fasse

(57) ABSTRACT

A hermetic terminal for a hard disk device (HDD device) that has an excellent gas barrier property and can be assembled in a small number of man-hours, and a hard disk device are provided. The hermetic terminal for an HDD device includes a metal eyelet, insulating glass which seals the metal eyelet on a side of an inner diameter of the metal eyelet, and a lead sealed by the insulating glass to pass therethrough. The lead includes a contact made of a conductive elastic material.

9 Claims, 3 Drawing Sheets

(51) Int. Cl.
  *G11B 25/04* (2006.01)
  *G11B 33/14* (2006.01)
  *G11B 33/12* (2006.01)
  *H01R 9/16* (2006.01)
(52) U.S. Cl.
  CPC ............ *G11B 33/14* (2013.01); *G11B 33/146* (2013.01); *H01R 9/16* (2013.01); *H05K 5/069* (2013.01)
(58) Field of Classification Search
  CPC ..... G11B 25/043; G11B 33/12; G11B 33/146; H01R 9/16
  USPC ........ 174/50.5, 50.52, 50.53, 520, 650, 659, 174/152 GM, 262, 50.56; 439/909, 587; 361/306.3, 298.4, 299.5, 306.1, 302
  See application file for complete search history.

(56) References Cited

U.S. PATENT DOCUMENTS

| | | | | |
|---|---|---|---|---|
| 7,564,674 | B2* | 7/2009 | Frysz | H01G 4/232 361/301.2 |
| 8,378,239 | B2* | 2/2013 | Lakner | H01R 13/521 174/650 |
| 8,461,456 | B2* | 6/2013 | Bernauer | H01R 13/521 174/152 G |
| 8,536,468 | B2* | 9/2013 | Teske | A61N 1/3754 174/152 GM |
| 8,604,341 | B2* | 12/2013 | Barry | A61N 1/3754 174/50.6 |
| 8,642,887 | B1* | 2/2014 | Li | A61N 1/3754 174/50.6 |
| 8,648,265 | B2* | 2/2014 | Talamine | H01G 4/35 174/520 |
| 2008/0165449 | A1 | 7/2008 | Shindo et al. | |
| 2009/0168233 | A1 | 7/2009 | Kouno et al. | |
| 2012/0080713 | A1 | 4/2012 | Agatani et al. | |

FOREIGN PATENT DOCUMENTS

| | | |
|---|---|---|
| JP | 2002-117926 A | 4/2002 |
| JP | 2005-293979 A | 10/2005 |
| JP | 2006-092794 A | 4/2006 |
| JP | 2006-210184 A | 8/2006 |
| JP | 2008-171482 A | 7/2008 |
| JP | 2009-157988 A | 7/2009 |
| JP | 2012-079855 A | 4/2012 |
| JP | 2016-036000 A | 3/2016 |

OTHER PUBLICATIONS

PCT International Preliminary Report on Patentability including English Translation of PCT Written Opinion of the International Searching Authority for International Application PCT/JP2017/022679, dated Jan. 1, 2019, 6 pages, International Bureau of WIPO, Geneva, Switzerland.

* cited by examiner

HERMETIC TERMINAL FOR HDD DEVICE AND HARD DISK DEVICE

TECHNICAL FIELD

The present invention relates to a hermetic terminal for HDD device used for a hard disk device and a hard disk device.

BACKGROUND ART

A hermetic terminal (which is also called a feedthrough) represents a hermetically sealed arrangement of a lead wire in an insertion hole in a metal eyelet with an insulating material being interposed. The hermetic terminal is used in supplying a current to an electrical device or an element accommodated in a hermetic enclosure or leading out a signal from an electrical device or an element to the outside.

A hermetic terminal of a glass-to-metal-seal (GTMS) type in which a metal eyelet and a lead wire are sealed by insulating glass is broadly categorized into two types of matched sealing and compression sealing. In order to ensure reliability of hermetic sealing, it is important to properly select a coefficient of thermal expansion of a metal material for an eyelet and a lead wire and insulating glass.

Insulating glass for sealing is determined by a source material for a metal eyelet and a lead wire, a required temperature profile, and a coefficient of thermal expansion of insulating glass. In matched GTMS, a source material for sealing is selected such that a metal material and insulating glass are identical in coefficient of thermal expansion as much as possible. In a matched-GTMS hermetic terminal, in order to ensure reliability of hermeticity and electrical insulation, in general, a Kovar alloy (composed of 54% Fe, 28% Ni, and 18% Co) identical in coefficient of thermal expansion to a glass material in a wide temperature range is employed as a source material for the metal eyelet and the lead wire, and the metal eyelet and the lead wire are sealed by insulating glass such as borosilicate glass.

Such a hermetic terminal is used also as a connection terminal of a hard disk drive (HDD) mounted on a personal computer and the like. The HDD in recent years is required to be silent and power-saving in addition to being high in memory capacity, high in storage density, and stable in high-speed access. In order to meet such requirements, as described in Japanese Patent Laying-Open No. 2008-171482 (PTL 1), an HDD in which windage due to rotation of a magnetic disc (which is also called a platter) at a high speed is significantly reduced by filling a housing accommodating the platter with low-density gas such as He is available. Low-density gas such as He or hydrogen readily diffuses or leaks because of its extremely small molecular size. Therefore, a hermetic terminal has increasingly been employed in order to retain and seal such low-density gas in the housing.

In general, an HDD device is constituted of an aluminum housing which accommodates a mechanical portion such as a voice coil motor, a head stack assembly, a disc, and a spindle motor and a circuit substrate which controls the mechanical portion. In an HDD device without including a hermetic terminal, the mechanical portion in the housing described above and the circuit substrate may electrically be connected to each other through a connector with elastic contact pin of a small outline package (SOP) type. This connector with elastic contact pin is attached to a substrate lid. The substrate lid is attached to close an opening in the housing and made of a glass epoxy substrate such as FR4. This connector with elastic contact pin is surface-mounted on a through via of the substrate lid. The connector with elastic contact pin is brought into contact with the mechanical portion and a control circuit by a pressure in screwing and fastening the circuit substrate to the housing to thereby electrically connect them to each other.

CITATION LIST

Patent Literature

PTL 1: Japanese Patent Laying-Open No. 2008-171482

SUMMARY OF INVENTION

Technical Problem

In an HDD device including a conventional connector with elastic contact pin, however, a substrate lid made of a glass epoxy substrate poor in gas barrier property has been used for sealing of the housing. Therefore, low-density gas such as hydrogen or He filled in the housing disadvantageously tends to leak. A connector with contact pin should be mounted in advance on the substrate lid and additional man-hours and components have been required, which has not been cost-efficient.

The present invention was proposed to solve the above-described problems, and an object of the present invention is to provide a hermetic terminal for HDD device which is excellent in gas barrier property and can be smaller in number of man-hours for assembly and a hard disk device.

Solution to Problem

A hermetic terminal for HDD device according to one embodiment of the present invention includes a metal eyelet, insulating glass which seals the metal eyelet on a side of an inner diameter of the metal eyelet, and a lead sealed by the insulating glass to pass therethrough. The lead includes a contact made of a conductive elastic material.

In the hermetic terminal for HDD device, the contact may be made of a spring material low in electrical resistance.

In the hermetic terminal for HDD device, the contact may be implemented by a compression spring selected from the group consisting of a helical spring, a helical conical spring, a barrel-shaped spring, an hourglass-shaped helical spring, a beehive compression spring, a U-shaped flat spring, a dog-leg shaped flat spring, a U-shaped bar spring, and a dog-leg shaped bar spring.

In the hermetic terminal for HDD device, the contact may be made of a material selected from the group consisting of phosphor bronze, nickel silver, stainless steel, a Be—Cu alloy, a Cu—Ti alloy, a Cu—Ni alloy, a Cu—Ni—Sn alloy, a Cu—Ni—Si alloy, and a Cu—Ni—Sn—Zn—Mn alloy.

In the hermetic terminal for HDD device, a surface of the contact may be provided with a plating made of an alloy mainly composed of at least one metal selected from the group consisting of Ag, Au, Cu, Ni, Sn, Pt, and Pd or a solder alloy.

A hard disk device according to one embodiment of the present invention includes any hermetic terminal for HDD device described above.

Advantageous Effects of Invention

According to the present invention, a hermetic terminal for HDD device which is excellent in gas barrier property

DESCRIPTION OF EMBODIMENTS

A hermetic terminal for HDD device according to a first embodiment of the present invention includes a metal eyelet, insulating glass which seals the metal eyelet on a side of an inner diameter of the metal eyelet, and a lead sealed by the insulating glass to pass therethrough. The lead includes a contact made of a conductive elastic material.

Any contact may be applicable so long as it is made of a conductive elastic material, and a shape or a material therefor is not limited. A helical spring having a surface plated with a metal material low in resistance can be employed as the contact by way of example. The contact can be provided at an end of the lead.

Figure 1A:
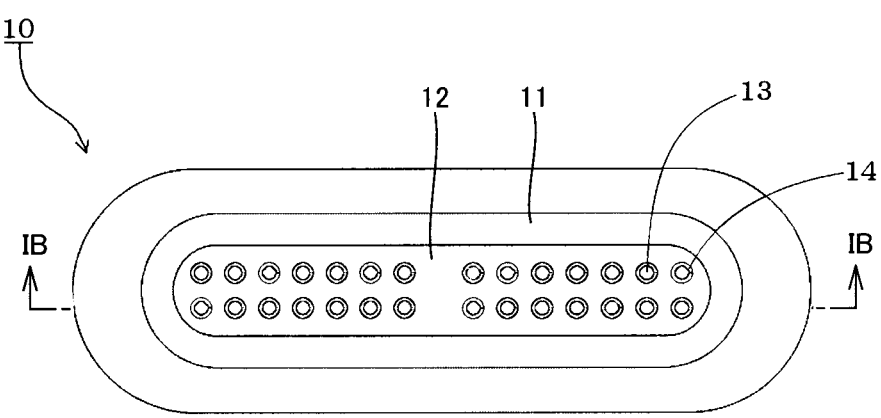
FIG. 1A is a plan view showing a hermetic terminal 10 for HDD device according to an embodiment.
Figure 1B:
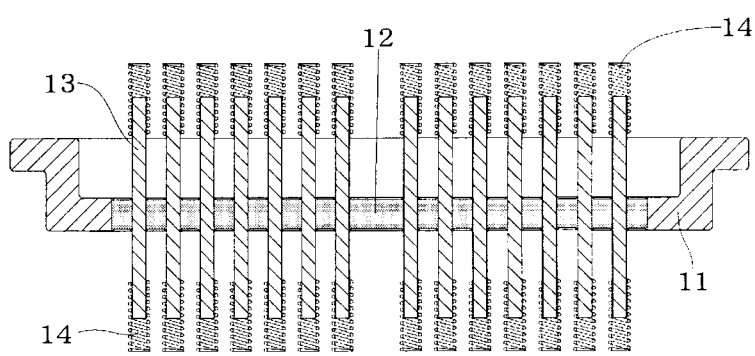
FIG. 1B is a cross-sectional view along the line IB-IB in FIG. 1A which shows hermetic terminal 10 for HDD device according to the embodiment.
Figure 1C:
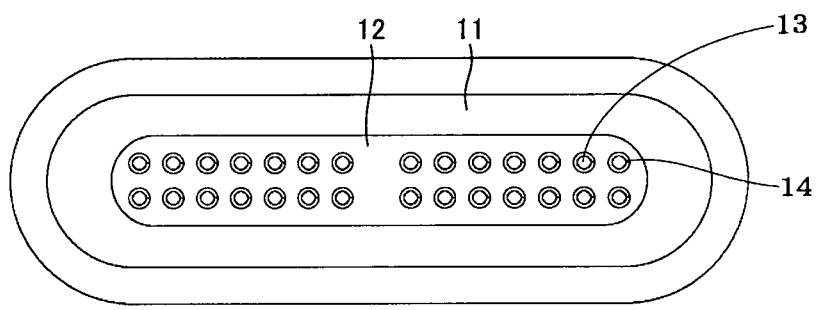
FIG. 1C is a bottom view showing hermetic terminal 10 for HDD device according to the embodiment.

A hermetic terminal 10 for HDD device according to the present embodiment includes a metal eyelet 11, insulating glass 12 which seals metal eyelet 11 on a side of an inner diameter of metal eyelet 11, and a lead 13 sealed by insulating glass 12 to pass therethrough, as shown in FIGS. 1A to 1C. Lead 13 includes a contact 14 implemented by a helical compression spring made of a metal at least at one end. In the present embodiment, contact 14 is provided at opposing ends of lead 13.

The helical spring which forms contact 14 may be changed to a helical conical spring, a barrel-shaped spring, an hourglass-shaped helical spring, a beehive compression spring, a U-shaped flat spring, a dog-leg shaped flat spring, a U-shaped bar spring, or a dog-leg shaped bar spring. A direction of attachment of an anisotropic spring such as a helical conical spring and a beehive compression spring can be selected as necessary.

The barrel-shaped spring refers to a helical spring of which axially central portion is greater in diameter than opposing ends. The hourglass-shaped helical spring refers to a helical spring of which axially central portion is smaller in diameter than opposing ends. The beehive compression spring refers to a helical spring of which only one side is made smaller in diameter. The bar spring refers to a spring made of a bar-shaped spring material. In other words, the bar spring means a spring obtained by replacing a plate material for a flat spring with a bar material.

An area of contact between contact 14 and a contact target can be increased, for example, by attaching a small diameter side of a helical conical spring to an end of lead 13 such that the helical conical spring spreads toward a tip end.

Since lateral displacement of a spring from an axial direction can be suppressed by employing, for example, a barrel-shaped spring, contact at a prescribed position can reliably be achieved.

Contact 14 is made of a spring material low in electrical resistance. Examples of the spring material low in electrical resistance include phosphor bronze, nickel silver, stainless steel, a Be—Cu alloy, a Cu—Ti alloy, a Cu—Ni alloy, a Cu—Ni—Sn alloy, a Cu—Ni—Si alloy, and a Cu—Ni—Sn—Zn—Mn alloy. A surface of contact 14 may be provided with a plating made of a metal material low in resistance such as an alloy mainly composed of at least one metal selected from the group consisting of Ag, Au, Cu, Ni, Sn, Pt, and Pd or a solder alloy as necessary. Contact 14 of the hermetic terminal for HDD device according to the present embodiment is not limited to SOP type pin arrangement, and pin arrangement can be modified as necessary. For example, pin grid array (PGA) type pin arrangement like grids can also be adopted.

Hermetic terminal 10 for HDD device according to the present embodiment includes metal eyelet 11 composed of Kovar, insulating glass 12 composed of borosilicate glass which seals metal eyelet 11 on the side of the inner diameter of metal eyelet 11, and lead 13 composed of Kovar which is sealed by insulating glass 12 to pass therethrough, by way of example, as shown in FIGS. 1A to 1C. Lead 13 includes contact 14 implemented by a helical compression spring composed of a Cu—Ni—Sn alloy at opposing ends.

Hermetic terminal 10 for HDD device in the present embodiment is hermetically secured in an opening in an aluminum housing accommodating the mechanical portion such as a voice coil motor, a head stack assembly, a disc, and a spindle motor by way of example. An HDD device is implemented by electrical connection of hermetic terminal 10 for HDD device to the mechanical portion in the housing and further electrical connection to a circuit substrate arranged outside the housing which controls the mechanical portion.

In order to check a gas barrier property of hermetic terminal 10 for HDD device according to the present embodiment, a conventional substrate lid made of FR4 and hermetic terminal 10 for HDD device according to the present embodiment were compared with each other by using a He gas blowing method. In the He gas blowing method, initially, a tested product was attached in an opening in a vacuum chamber provided with a He sensor. The vacuum chamber was evacuated and He gas was blown toward a surface of the tested product outside the vacuum chamber. An amount of He gas which passed through the tested product and leaked into the vacuum chamber at a differential pressure of one atmospheric pressure was measured.

Based on comparison in this method, the substrate lid made of FR4 achieved $1.0 \times 10^{-9}$ Pa·m³/sec., whereas hermetic terminal 10 for HDD device achieved $1.0 \times 10^{-13}$ Pa·m³/sec. It was found that hermetic terminal 10 for HDD device was extremely small in gas leakage and excellent.

Since the hermetic terminal for HDD device in the present embodiment includes a contact in the glass-sealed lead which is excellent in gas barrier property, the hermetic terminal for HDD device alone functions as both of the conventional substrate lid and the connector with elastic contact pin. A step of mounting the connector with elastic contact pin onto the substrate lid as in a conventional example is not necessary. Consequently, the number of components and the number of man-hours for assembly can be reduced. In addition, the HDD device can be reduced in size and height.

The hermetic terminal for HDD device in the present embodiment is hermetically attached to the housing by being connected to the mechanical portion of the HDD device. By fastening the housing and a circuit substrate to each other, the mechanical portion in the housing and the circuit substrate can be connected to each other by the hermetic terminal for HDD device in a simplified and space-saving manner, without using solder. By utilizing elastic contact owing to the contact, tolerance in positioning of the circuit substrate and an error in parallelism and flatness can be accommodated.

Figure 2A:
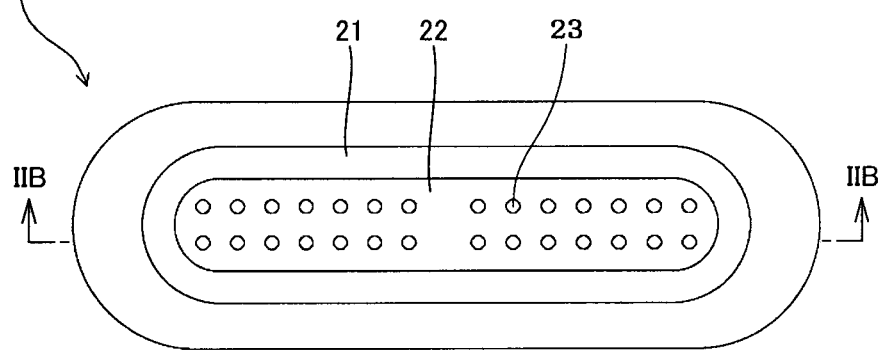
FIG. 2A is a plan view showing a hermetic terminal 20 for HDD device according to an embodiment.
Figure 2B:
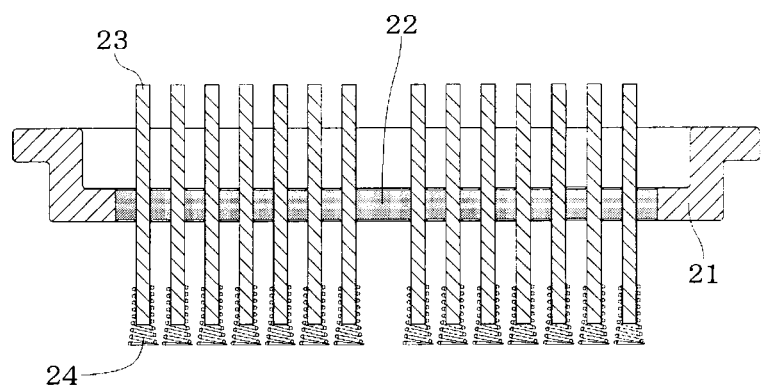
FIG. 2B is a cross-sectional view along the line IIB-IIB in FIG. 2A which shows hermetic terminal 20 for HDD device according to the embodiment.
Figure 2C:
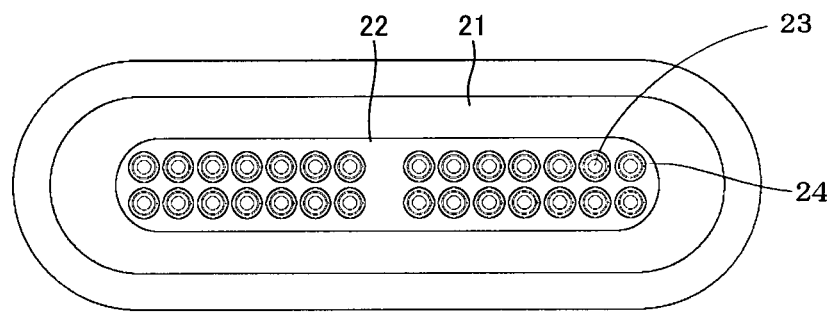
FIG. 2C is a bottom view showing hermetic terminal 20 for HDD device according to the embodiment.

A difference of a hermetic terminal for HDD device according to a second embodiment from the first embodiment will mainly be described. A hermetic terminal 20 for HDD device according to the present embodiment includes a metal eyelet 21 composed of Kovar, insulating glass 22 composed of borosilicate glass which seals metal eyelet 21 on a side of an inner diameter of metal eyelet 21, and a lead 23 composed of Kovar which is sealed by insulating glass 22 to pass therethrough, as shown in FIGS. 2A to 2C. Lead 23 includes a contact 24 implemented by a helical conical compression spring composed of phosphor bronze at one end. In the present embodiment, contact 24 is provided at a tip end of lead 23 located inside the housing.

Hermetic terminal 20 for HDD device is hermetically secured in an opening in an aluminum housing accommodating the mechanical portion such as a voice coil motor, a head stack assembly, a disc, and a spindle motor by way of example. An HDD device is implemented by electrical connection of hermetic terminal 20 for HDD device to the mechanical portion in the housing and further connection to a circuit substrate arranged outside the housing which controls the mechanical portion.

Figure 3A:
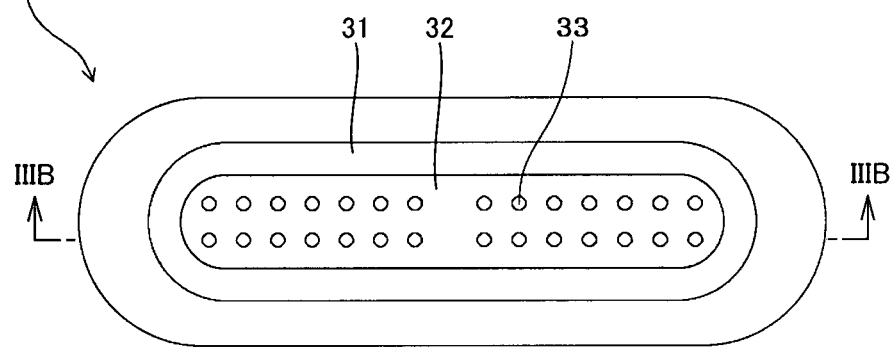
FIG. 3A is a plan view showing a hermetic terminal 30 for HDD device according to an embodiment.
Figure 3B:
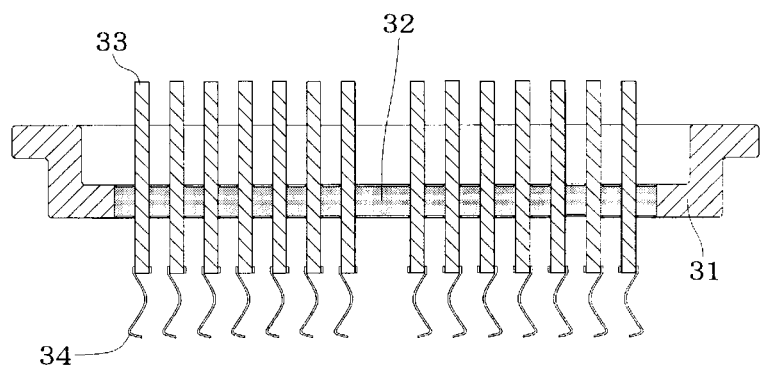
FIG. 3B is a cross-sectional view along the line IIIB-IIIB in FIG. 3A which shows hermetic terminal 30 for HDD device according to the embodiment.
Figure 3C:
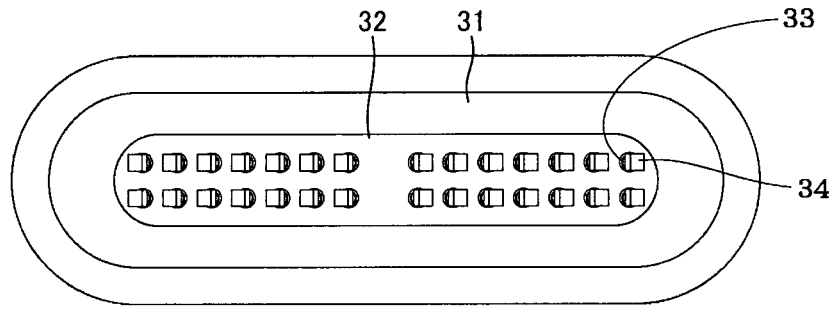
FIG. 3C is a bottom view showing hermetic terminal 30 for HDD device according to the embodiment.

A difference of a hermetic terminal for an HDD device according to a third embodiment from the first embodiment will mainly be described. A hermetic terminal 30 for HDD device according to the present embodiment includes a metal eyelet 31 composed of Kovar, insulating glass 32 composed of borosilicate glass which seals metal eyelet 31 on a side of an inner diameter of metal eyelet 31, and a lead 33 composed of Kovar which is sealed by insulating glass 32 to pass therethrough, as shown in FIGS. 3A to 3C. Lead 33 includes a contact 34 implemented by a dog-leg shaped flat spring composed of stainless steel at one end. In the present embodiment, contact 34 is provided at a tip end of lead 33 located inside the housing.

Hermetic terminal 30 for HDD device is hermetically secured in an opening in an aluminum housing accommodating the mechanical portion such as a voice coil motor, a head stack assembly, a disc, and a spindle motor. An HDD device is implemented by electrical connection of hermetic terminal 30 for HDD device to the mechanical portion in the housing and further connection to a circuit substrate arranged outside the housing which controls the mechanical portion.

It should be understood that the embodiments disclosed herein are illustrative and non-restrictive in every respect. The scope of the present invention is defined by the terms of the claims rather than the description above and is intended to include any modifications within the scope and meaning equivalent to the terms of the claims.

INDUSTRIAL APPLICABILITY

The present invention can be applied to a hermetic terminal for an HDD device, and in particular, can suitably be used for an HDD required to be high in hermeticity of a housing containing low-density gas such as He gas.

REFERENCE SIGNS LIST 10, 20, 30 hermetic terminal for HDD device; 11, 21, 31 metal eyelet; 12, 22, 32 insulating glass; 13, 23, 33 lead; 14, 24, 34 contact

The invention claimed is:

1. A hermetic terminal for HDD device comprising:
a metal eyelet with an opening;
insulating glass which seals the opening of the metal eyelet on a side of an inner diameter of the opening;
a lead, wherein the lead passes through and is sealed by the insulating glass in the opening of the metal eyelet, the lead protrudes away from the insulating glass and the metal eyelet, and the lead has a free end portion terminating at a free end thereof spaced away from the insulating glass and the metal eyelet; and
a contact made of a conductive elastic material, wherein the contact is partially arranged outwardly on an outer surface of the free end portion of the lead and partially protrudes freely beyond the free end of the lead, and wherein the contact is spaced away from the insulating glass and the metal eyelet.

2. The hermetic terminal for HDD device according to claim 1, wherein the contact is made of a spring material low in electrical resistance.

3. The hermetic terminal for HDD device according to claim 1, wherein the contact comprises a spring selected from the group consisting of a U-shaped flat spring, a dog-leg shaped flat spring, a U-shaped bar spring, and a dog-leg shaped bar spring.

4. The hermetic terminal for HDD device according to claim 1, wherein the contact is made of a material selected from the group consisting of phosphor bronze, nickel silver, stainless steel, a Be—Cu alloy, a Cu—Ti alloy, a Cu—Ni alloy, a Cu—Ni—Sn alloy, a Cu—Ni—Si alloy, and a Cu—Ni—Sn—Zn—Mn alloy.

5. The hermetic terminal for HDD device according to claim 1, wherein the contact comprises a contact core and a plating on a surface of the contact core, and wherein the plating is made of an alloy mainly composed of at least one metal selected from the group consisting of Ag, Au, Cu, Ni, Sn, Pt, and Pd or a solder alloy.

6. A hard disk apparatus comprising a hard disk device and the hermetic terminal for HDD device according to claim 1.

7. The hard disk apparatus according to claim 6, wherein the hard disk device comprises a housing that has an opening, and wherein the hermetic terminal is hermetically secured in the opening and serves as a lid that hermetically seals the opening and hermetically closes the housing.

8. The hermetic terminal for HDD device according to claim 1, wherein the contact comprises a compression spring selected from the group consisting of a barrel-shaped helical spring and an hourglass-shaped helical spring.

9. The hermetic terminal for HDD device according to claim 1, wherein the contact comprises a helical conical spring having a proximal end thereof arranged on the free end portion of the lead and having a distal end thereof protruding freely away from the metal eyelet and the insulating glass, wherein the distal end has a larger diameter than the proximal end.

\* \* \* \* \*